US008189350B2

(12) United States Patent
Gaub et al.

(10) Patent No.: US 8,189,350 B2
(45) Date of Patent: May 29, 2012

(54) INPUT/OUTPUT MODULE FOR AN AUTOMATION DEVICE

(75) Inventors: Gernot Gaub, Hockenheim (DE); Andreas Wilmers, Heidelberg (DE)

(73) Assignee: ABB AG, Mannheim (DE)

( * ) Notice: Subject to any disclaimer, the term of this patent is extended or adjusted under 35 U.S.C. 154(b) by 232 days.

(21) Appl. No.: 12/620,964

(22) Filed: Nov. 18, 2009

(65) Prior Publication Data

US 2010/0124029 A1 May 20, 2010

(30) Foreign Application Priority Data

Nov. 18, 2008 (DE) ........................ 10 2008 058 090

(51) Int. Cl.
*H01R 9/00* (2006.01)

(52) U.S. Cl. ........................................................ 361/823

(58) Field of Classification Search .................. 361/823, 361/733, 752, 756, 796, 801–802; 439/61, 439/668

See application file for complete search history.

(56) References Cited

U.S. PATENT DOCUMENTS 5,961,335 A * 10/1999 Kubernus et al. ............ 439/76.1

* cited by examiner

*Primary Examiner* — Jeremy Norris
*Assistant Examiner* — Tremesha S Willis
(74) *Attorney, Agent, or Firm* — Leydig, Voit & Mayer, Ltd.

(57) ABSTRACT

An input/output module for an automation device includes a housing having a lower part separable from an upper part; a first printed circuit board disposed in the housing; and an electronic subassembly for an input/output function of the input/output module. The electronic subassembly includes a plurality of connection elements disposed on the first printed circuit board and configured to connect signal lines and process voltage lines, the plurality of connecting elements being accessible from a front side of the upper part; and a plurality of optical waveguides disposed on the front side, wherein each one of the plurality of optical waveguides is assigned to a respective one of the plurality of connection elements and each configured to signal a state of at least one input/output channel of the input/output module.

11 Claims, 7 Drawing Sheets

10
13
4
3
2
5
6

INPUT/OUTPUT MODULE FOR AN AUTOMATION DEVICE

Priority is claimed to German Application No. 10 2008 058 090.2, filed Nov. 18, 2008, the entire disclosure of which is incorporated by reference herein.

The invention relates to an input/output module for a flexible expandable automation device.

BACKGROUND

Commercially available expandable automation devices (also known as programmable logic controllers) or expandable automation devices described in patent documents can be adapted to a wide variety of automation tasks and are used, in particular, in the field of industrial automation technology and in the field of switching and control technology.

These automation systems are usually constructed in modular form from a central subassembly, communication couplers and expansion modules, for example input/output modules.

According to the known prior art, the input/output modules which are electrically connected to a central subassembly having the central processing unit (CPU) via an internal bus connection in the form of an input/output bus comprise a separable housing which comprises two parts and has at least one front cover, connection terminals and display means for displaying the current operating state of a switching and/or control module assigned to the respective connection terminal (also referred to as signalling the state of the input/output channels).

Input/output modules, in the housing lower part of which a plurality of printed circuit boards are inserted into a housing lower part, are known according to the prior art. Electronic subassemblies for input/output functions, connection terminals and display means, for example for displaying the current operating state of a switching and/or control module assigned to the respective connection terminal, are arranged on the printed circuit boards in the input/output modules. The connection terminals are electrically connected to the printed circuit boards according to their function and are routed out of the housing on the rear part of the housing lower part. The connection terminals are therefore not accessible from the front side of the module which has the display means.

Owing to the mechanical design, in particular the use of a plurality of printed circuit boards for implementing the functions of the input/output module, the previously described input/output module requires a considerable amount of space and is complicated and costly to produce.

SUMMARY OF THE INVENTION

Accordingly, the invention is based on the object of providing a cost-effective input/output module of simple construction for an automation device, in which the abovementioned disadvantages are overcome and which has, in particular, a more compact design than the known input/output modules and can be produced in a cost-effective manner. The input/output module may be an input module, an output module or else an input and output module.

The invention provides for the number of carriers which are arranged in the input/output module and are in the form of printed circuit boards or boards to be reduced by arranging the electronic subassembly for the input/output function of the input/output module on a first printed circuit board situated in the housing of the input/output module. A second printed circuit board for connecting through the signals from an input/output bus is also provided.

Furthermore, provision is also made for the connection elements, which make it possible, for example, to connect signal lines and process voltages from external field devices, and the connection for the input/output bus to be integrated on the first printed circuit board. A cost-effective input/output module can therefore be produced by arranging the connection elements for process plug connectors or process signals, which connection elements are preferably in the form of pluggable terminals, on the first printed circuit board.

The connection elements are preferably in the form of screw terminals, insulation-piercing connectors or spring-type or spring force terminals and are accessible from the front side of the input/output device.

According to one advantageous embodiment of the input/output module according to the invention, optical waveguides which are intended to focus the light from the display means and contactlessly transmit it to the front side of the input/output module are provided on the first printed circuit board for the purpose of signalling the state of the input/output channels.

BRIEF DESCRIPTION OF THE DRAWINGS

The invention and advantageous refinements, improvements and further advantages of the invention are intended to be described and explained in more detail using the embodiments illustrated in the following figures, in which.

DETAILED DESCRIPTION

Figure 1:
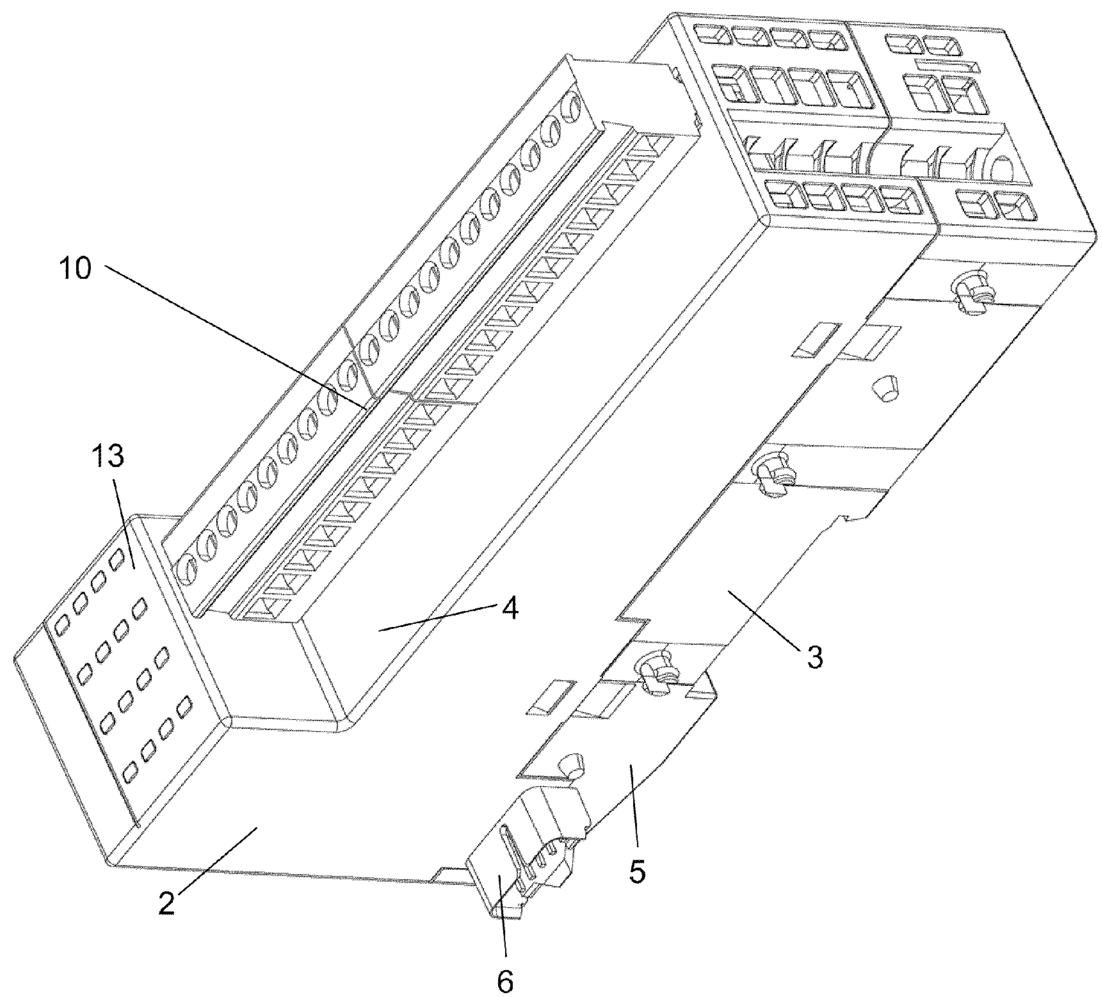
FIG. 1 shows an exemplary input and output module.

FIG. 1 shows an exemplary design of an input/output module 1 for a flexible expandable automation device, said module having a two-part housing 2 comprising a housing lower part 3 and a housing upper part 2. A first printed circuit board and a second printed circuit board are installed on the housing lower part 3. The first printed circuit board has an electronic subassembly for the input/output function of the input/output module 1, and the second printed circuit board is intended to connect through the signals from an input/output bus.

Connection elements 10 which are in the form of pluggable terminals and are intended to connect signal lines and process voltages are accessible from the housing front side 4.

Display means 13 which are intended to display the current operating state of a switching and/or control module (not illustrated in FIG. 1) assigned to the respective connection terminal 10 are also arranged on the device front side. The display means 13 are in the form of optical waveguides and are intended to focus the light at a defined point and contactlessly transmit it to the front side 4 of the input/output module 1. The light focused in the optical waveguides 51 used thus advantageously means that the light is output only at one point on the front side 4 of the input/output module 1.

Figure 2:
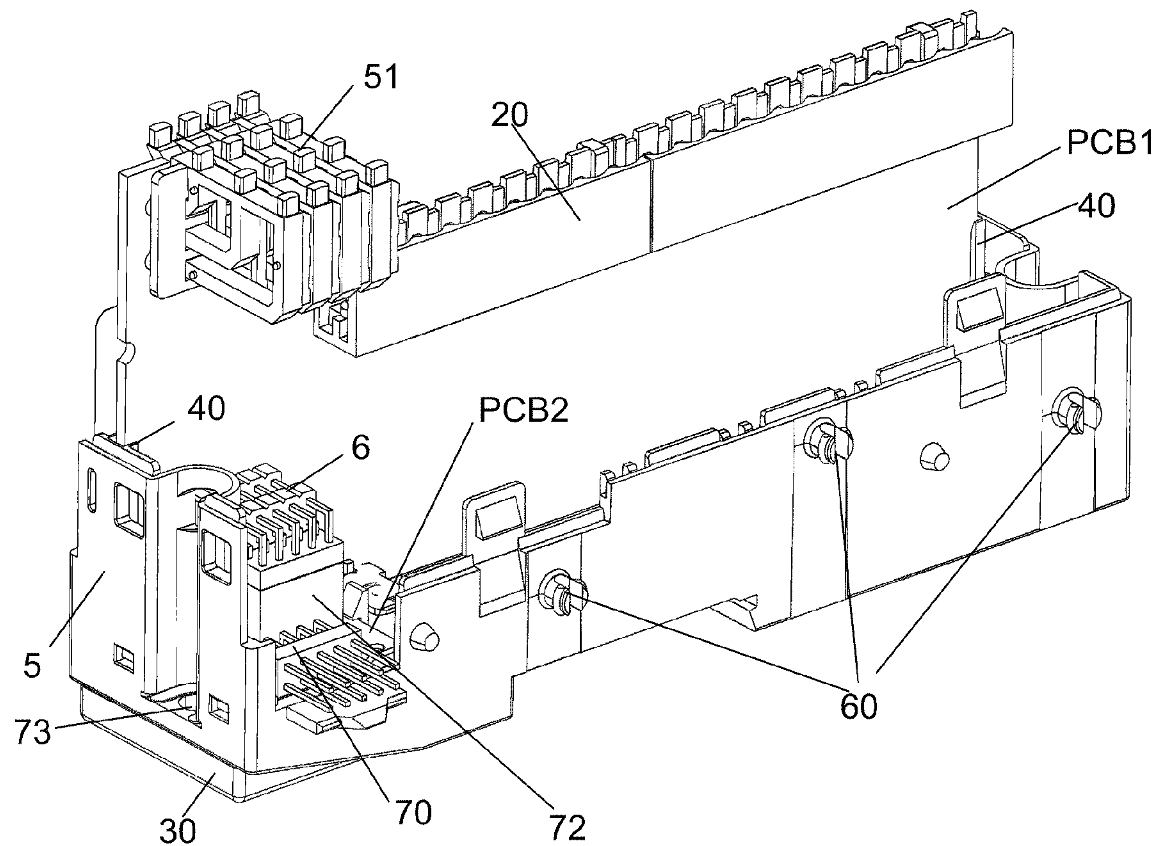
FIG. 2 shows an exemplary design of the printed circuit boards in the input/output module with the arrangement of the printed circuit boards and the connection and display means of the input and output module.

The connection terminals 10 are electrically connected to the electronic subassembly for the input/output function via a plug connector 20 illustrated in FIG. 2.

The pluggable connection terminal 10 may be produced from one or more multipole terminals by lining them up. The number of poles of the terminal 10 and of the corresponding plug connector 20 may be different depending on the number of input/output functions of the input/output module 1.

In addition to the electronic subassembly for the input/output function of the input/output module 1, the first printed circuit board also comprises, according to the invention, the plug connector 20 which is arranged on the first printed circuit board in such a manner that it, as well as the display means 13, is accessible from the front side 4 of the housing. A further connection element 6 which is preferably in the form of a standardized plug connector is also provided on the first printed circuit board for the purpose of transmitting the signals from the input/output bus on the second printed circuit board.

Figure 7:
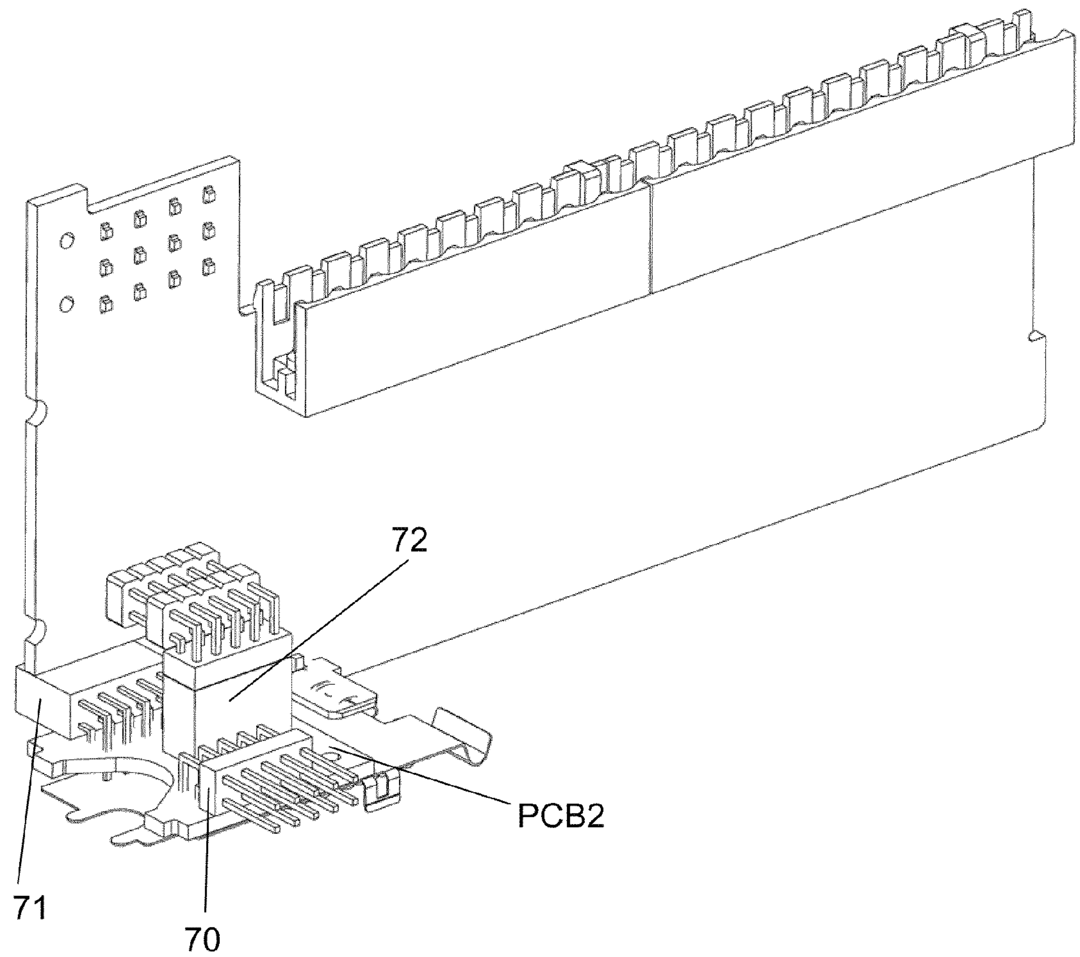
FIG. 7 shows the arrangement of the printed circuit boards with the plug connectors for connecting the input/output bus through to further modules of the automation device.

Further modules and the central processing unit of the automation system can be connected to the input/output module 1 via a second plug connector 70 illustrated in FIG. 7 and the input/output bus. The signals from the input/output bus can be connected through from module to module via the second plug connector 70 and a further plug connector 71 illustrated in FIG. 7.

FIG. 2 shows an exemplary design of the first printed circuit board PCB1 in the input/output module 1 for the electronic subassembly, which printed circuit board is inserted into guides 40. The guides 40 for the first printed circuit board PCB1 are preferably arranged in the inner region of the housing lower part 3 and in the lower region of the housing sides 5.

The plug connectors 20 are arranged on that side of the first printed circuit board PCB1 which faces away from the housing lower part 3, thus advantageously meaning that process plug connectors can be connected to the terminals 10 from the front side 4 of the housing. As shown by way of example in FIG. 2, the plug connectors 20 may be in the form of multipart elements, the number of plug connectors 20 used being flexible. The connection terminals 10 are preferably designed using spring-type or screw connection technology in order to connect signals and process voltages from external field devices, for example sensors and actuators.

Figure 3:
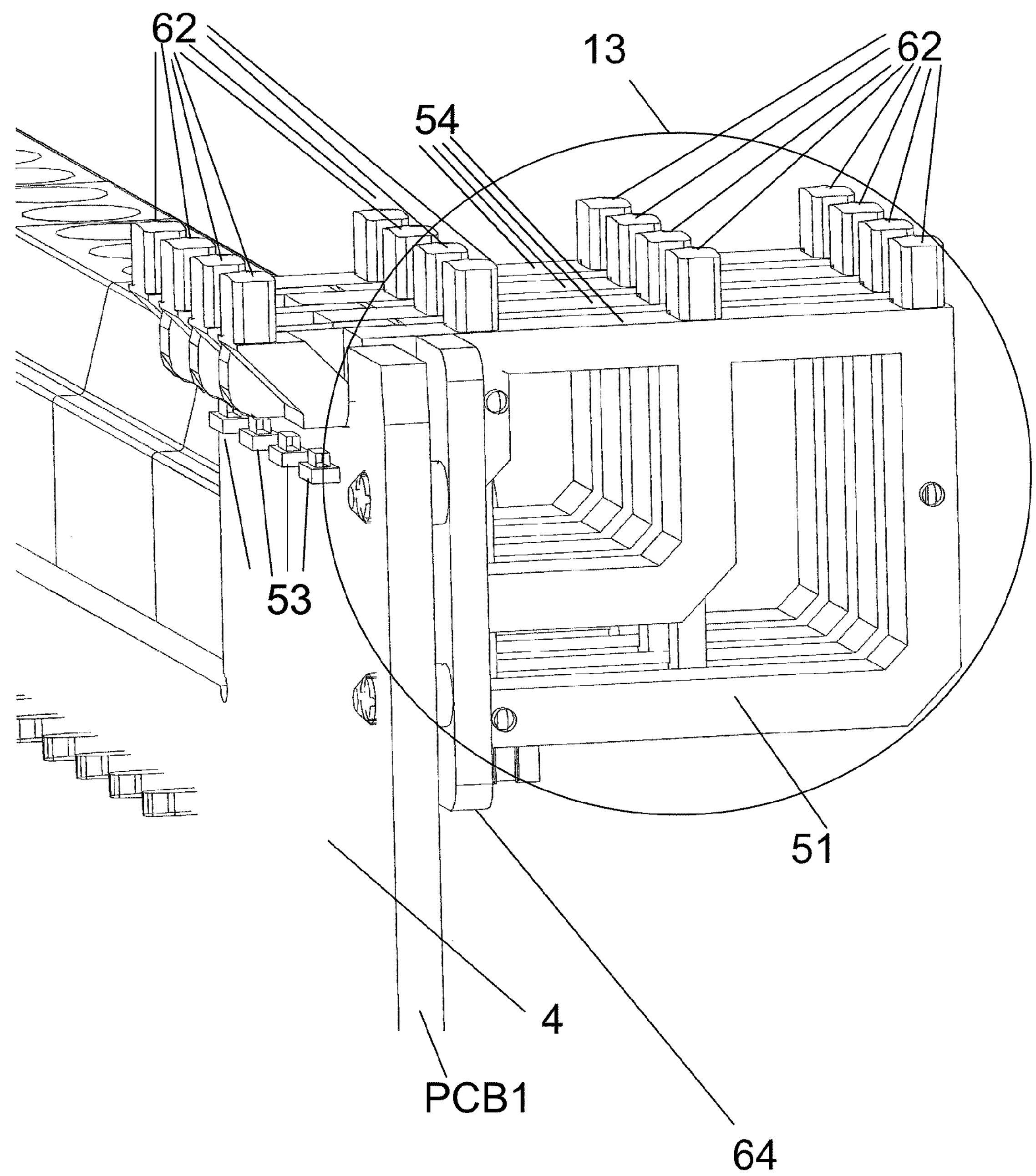
FIG. 3 shows an exemplary design of a display means of the input/output module.

Optical waveguides 51, the detailed illustration of which is shown by way of example in FIG. 3, are also plugged onto that side of the first printed circuit board PCB1 which faces away from the housing lower part 3.

The further connection element 6 for connecting the input/output bus is arranged on the first printed circuit board PCB1 in such a manner that it is plugged into the further plug connector 72 arranged on the second printed circuit board PCB2, as a result of which the signals from the input/output bus can be transmitted from the first printed circuit board PCB 1 to the second printed circuit board PCB2.

Connection means 60, preferably centering pins or mushroom-shaped latching elements, for connecting further modules to the input/output module 1 are also provided in the lower lateral region of the housing.

If the automation device containing the input/output module 1 and possibly required expansion modules is intended for wall mounting, an accessory 30 is used. The accessory 30 acts as a spacer and prevents deformation of the housing when fastening the module through a hole 73 by means of screw connections.

FIG. 3 shows an exemplary design of a display means 13 with a detailed illustration of the optical waveguide 51 of the input/output module 1, which means is arranged on the first printed circuit board PCB1. The display means 13 is formed by the optical waveguide 51 which focuses the light generated by optical display elements 53, preferably light-emitting diodes, and contactlessly transmits it to exit openings 62. The light focused by the optical waveguide 51 is thus transmitted from the display elements 53 to respectively associated light exit surfaces on the front side 4 of the input/output module 1.

A cover 64 holds the first optical waveguide 51 constructed from four identical parts 54 together and prevents crosstalk between the individual strands of the first optical waveguide 51.

The optical waveguide 51 may be constructed from a plurality of identical optical waveguide parts 54 arranged behind one another and may be configured in such a manner that simple and cost-effective injection moulds can be used to produce it. The design of the identical parts 54 of the optical waveguide 51 can be gathered from FIG. 5.

Figure 4:
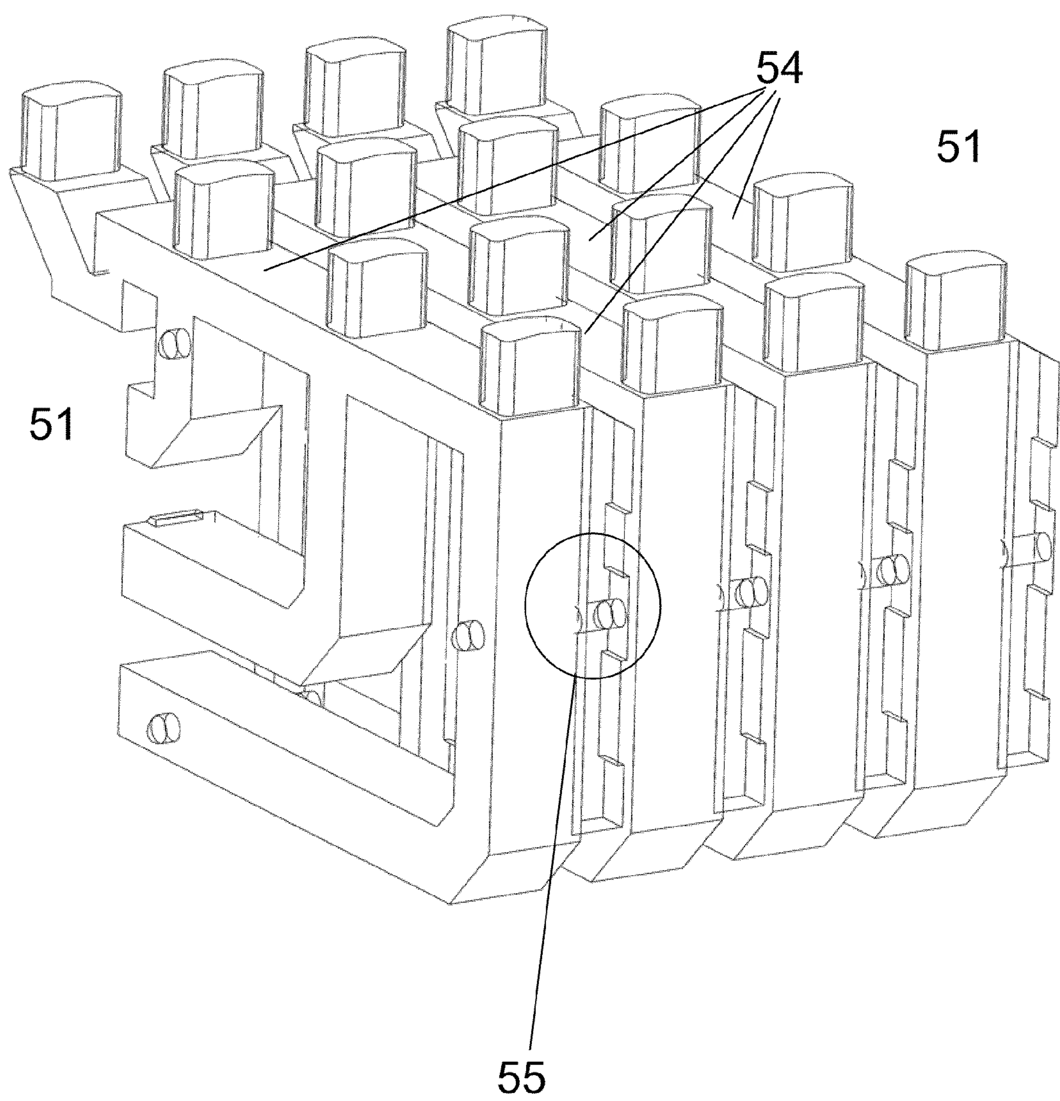
FIG. 4 shows an exemplary tenon/hole connection of identical parts which have been stacked on top of one another.

The identical parts 54 are arranged, for example, by stacking the identical parts 54 on top of one another, and the identical parts 54 are preferably connected by means of a tenon/hole connection. An exemplary tenon/hole connection 55 of identical parts 54 which have been stacked on top of one another is shown in FIG. 4.

Figure 5:
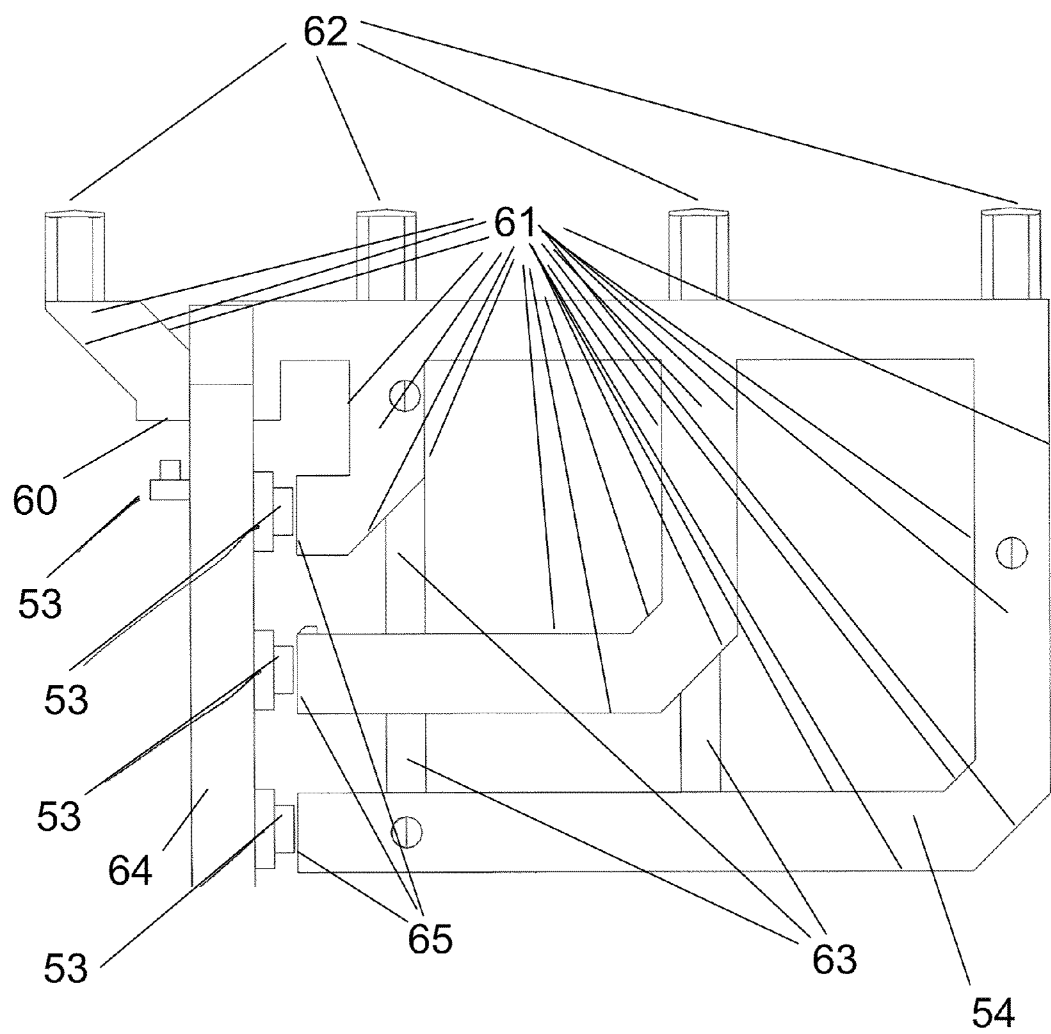
FIG. 5 shows an exemplary refinement of an identical part of the optical waveguide.

FIG. 5 illustrates an exemplary view of an identical part 54 of the optical waveguide 51 and illustrates the configuration of the identical part 54. The identical part 54 comprises four individual optical waveguide strands. The identical part 54 is stiffened by means of webs 63.

The light generated by the optical display elements 53 enters via entry surfaces 65 of the identical part 54, is then reflected at the surfaces 61 by means of total internal reflection and exits at the exit openings or in the surfaces 62.

Figure 6:
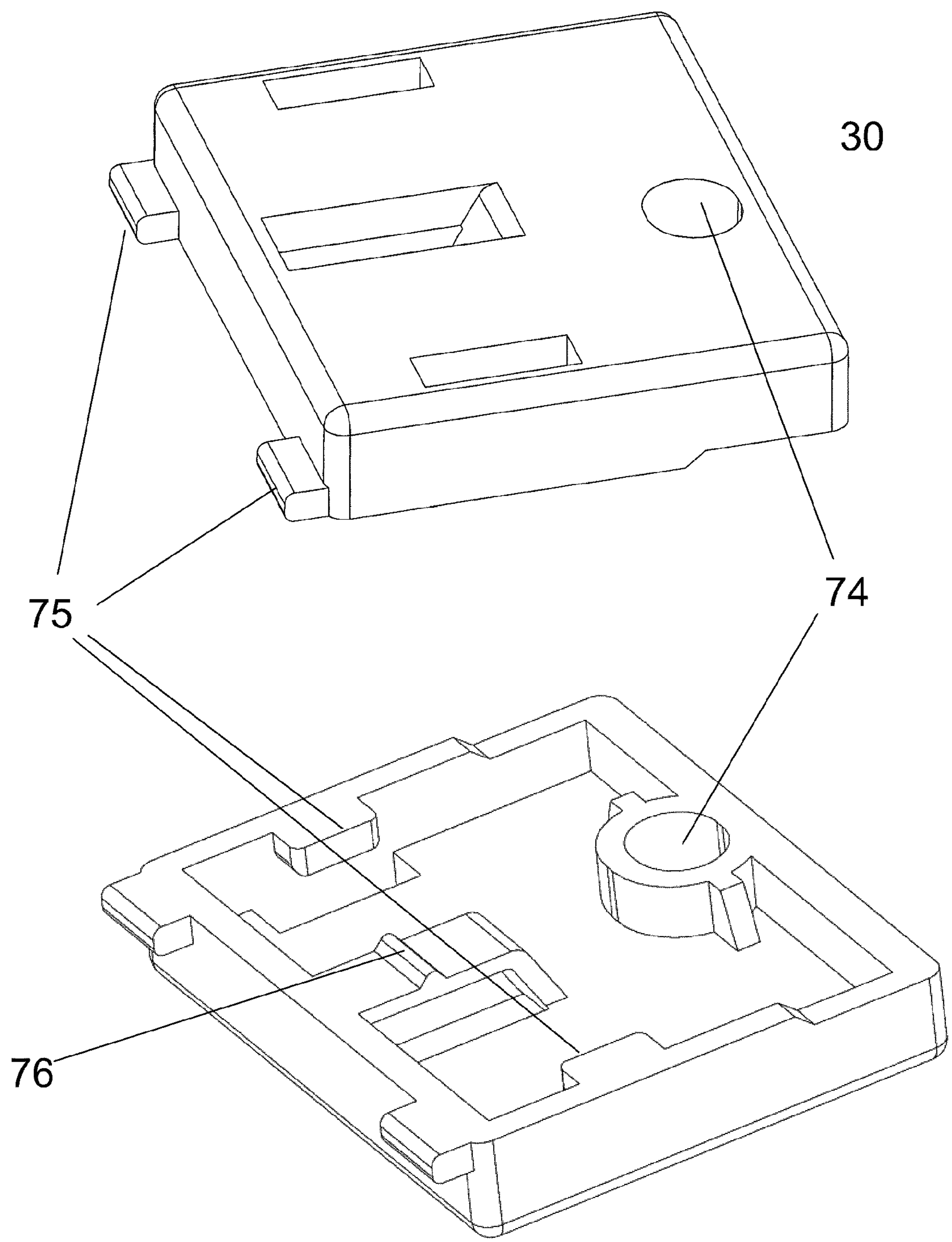
FIG. 6 shows an exemplary design of the accessory which is used as a spacer for fastening the input and output module by means of screw connections.

FIG. 6 shows an exemplary design of the accessory 30. The accessory 30 acts as a spacer and prevents deformation of the housing when fastening the input/output module 1 through the holes 73 and 74 by means of screw connections. The accessory 30 is aligned on the housing lower part 3 using studs 75, a latching lug 76 preventing the accessory 30 from falling out.

FIG. 7 shows the arrangement of the printed circuit boards PCB1, PCB2 with the plug connectors 70, 71 for connecting the input/output bus through to further modules of the automation device.

Further modules and the central processing unit of the automation system can be connected to the input/output module 1 via the second plug connector 70 and the input/output bus. The signals from the input/output bus can therefore be connected through from module to module via the second plug connector 70 and the further plug connector 71.

LIST OF REFERENCE SYMBOLS

1 Input/output module
2 Housing upper part
3 Housing lower part
4 Housing front side
5 Housing side
6 Further connection element, connection for input/output bus
10 Connection element
13 Display means

20 Plug connector
30 Accessory
51 Optical waveguide
53 Display element
54 Identical part of the optical waveguide
55 tenon/hole connection
56 Carrier
57 Connecting element
60 Connection means
61 Reflection surface
62 Exit openings, exit surface
63 Web
64 Cover
65 Entry opening
70 Second plug connector
71 Further plug connector
72 Further plug connector
73, 74 Hole
75 Stud
76 Latching lug
PCB1 First carrier, board, printed circuit board
PCB2 Second carrier, board, printed circuit board

What is claimed is:

1. An input/output module for an automation device comprising:

a housing having a lower part separable from an upper part;

a first printed circuit board disposed on the lower part of the housing;

a second printed circuit board disposed on the lower part of the housing and configured to connect signals from an input/output bus to the first printed circuit board; and an electronic subassembly for an input/output function of the input/output module including:

a plurality of connection elements disposed on the first printed circuit board and configured to connect signal lines and process voltage lines, the plurality of connection elements being accessible from a front side of the upper part; and a plurality of optical waveguides disposed on the front side, wherein each one of the plurality of optical waveguides is assigned to a respective one of the plurality of connection elements and each waveguide is configured to display an operating state of at least one respective input/output channel of the input/output module.

2. The input/output module as recited in claim 1, further comprising a terminal block connected to the plurality of connection elements and configured to support an electrical connection between the plurality of connection elements and at least one of a switching module and a control module, wherein the signal lines and the process voltage lines are connected to at least one of the switching and the control modules via the connection elements.

3. The input/output module as recited in claim 1, wherein the first printed circuit board includes a further connection element configured to connect an input/output bus so as to connect at least one further module.

4. The input/output module as recited in claim 3, wherein the second printed circuit board includes a second connection element, wherein the further connection element is connected to the second connection element, and wherein the input/output bus includes connection plugs projecting from a lower lateral region of the separable housing.

5. The input/output module as recited in claim 1, wherein the lower part includes at least one guide disposed in an inner region of the lower part and wherein the first printed circuit board is disposed in at least one guide.

6. The input/output module as recited in claim 5, wherein the at least one guide is disposed in a side of the lower part.

7. The input/output module as recited in claim 1, further comprising at least one connector disposed in a lower lateral region of the housing and configured to connect further modules to the input/output module.

8. The input/output module as recited in claim 7, wherein the at least one connector is one of a centering pin and a mushroom-shaped latching element.

9. The input/output module as recited in claim 1, further comprising a plurality of optical display elements disposed on the printed circuit board and wherein the plurality of optical waveguides forms a display device, each waveguide configured to focus light from a respective one of the optical display elements and to contactlessly transmit the light to the front side.

10. The input/output module as recited in claim 1, wherein the plurality of optical waveguides are identical.

11. The input/output module as recited in claim 1, wherein the separable housing includes more than two parts.

* * * * *